(12) United States Patent  
Liu

(10) Patent No.: US 8,300,470 B2
(45) Date of Patent: *Oct. 30, 2012

(54) TWO TERMINAL PROGRAMMABLE HOT CHANNEL ELECTRON NON-VOLATILE MEMORY

(75) Inventor: David K.Y. Liu, Fremont, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/079,486

(22) Filed: Apr. 4, 2011

(65) Prior Publication Data

US 2011/0176365 A1   Jul. 21, 2011

Related U.S. Application Data

(63) Continuation of application No. 12/869,469, filed on Aug. 26, 2010, now Pat. No. 7,920,426, which is a continuation of application No. 12/264,060, filed on Nov. 3, 2008, now Pat. No. 7,787,304.

(60) Provisional application No. 60/984,615, filed on Nov. 1, 2007.

(51) Int. Cl.
*G11C 11/34* (2006.01)

(52) U.S. Cl. .............................. 365/185.18; 365/185.24

(58) Field of Classification Search ............. 365/185.18, 365/185.24
See application file for complete search history.

(56) References Cited

U.S. PATENT DOCUMENTS

| 4,087,795 | A | 5/1978 | Rossler |
| 4,328,565 | A | 5/1982 | Harari |
| 4,412,311 | A | 10/1983 | Miccoli et al. |
| 4,532,611 | A | 7/1985 | Countryman, Jr. |
| 4,870,304 | A | 9/1989 | Bloker et al. |
| 5,021,999 | A | 6/1991 | Kohda et al. |
| 5,283,759 | A | 2/1994 | Smith |
| 5,410,268 | A | 4/1995 | Sharpe-Geisler |
| 5,548,146 | A | 8/1996 | Kuroda et al. |
| 5,586,073 | A | 12/1996 | Hiura et al. |
| 5,712,816 | A | 1/1998 | Cappelletti et al. |
| 6,055,191 | A | 4/2000 | Sher et al. |
| 6,303,516 | B1 * | 10/2001 | Morita et al. ................. 438/758 |
| 6,400,603 | B1 * | 6/2002 | Blyth et al. .............. 365/185.12 |
| 6,441,443 | B1 | 8/2002 | Hsu et al. |
| 6,489,202 | B1 | 12/2002 | Hsu et al. |
| 6,501,685 | B2 | 12/2002 | Hsu et al. |
| 6,631,087 | B2 | 10/2003 | Di Pede et al. |
| 6,678,190 | B2 | 1/2004 | Yang et al. |
| 6,914,825 | B2 | 7/2005 | Hsu et al. |
| 6,920,067 | B2 | 7/2005 | Hsu et al. |

(Continued)

OTHER PUBLICATIONS

Clendenin, Mike; "Flash maker eMemory gaining foundry converts," EE Times Asia, Nov. 6, 2003, 2 pages.

(Continued)

*Primary Examiner* — Michael Tran
(74) *Attorney, Agent, or Firm* — Lerner, David, Littenberg, Krumholz & Mentlik, LLP

(57) ABSTRACT

A programmable two terminal non-volatile device uses a floating gate that can be programed by a hot electron injection induced by a potential between a source and drain. The floating gate layer can also function as a FET gate for other circuits in an integrated circuit containing an array of the devices. The invention can be used in environments such as data encryption, reference trimming, manufacturing ID, security ID, and many other applications.

23 Claims, 5 Drawing Sheets

U.S. PATENT DOCUMENTS

| | | | |
|---|---|---|---|
| 7,032,064 B2* | 4/2006 | Barnett et al. | 711/103 |
| 7,471,570 B2 | 12/2008 | Morton et al. | |
| 7,528,036 B2 | 5/2009 | Adachi et al. | |
| 7,808,818 B2* | 10/2010 | Eitan | 365/185.03 |
| 7,852,672 B2 | 12/2010 | Liu et al. | |
| 7,876,615 B2 | 1/2011 | Liu et al. | |
| 2002/0118575 A1 | 8/2002 | Sonoda et al. | |
| 2003/0145154 A1* | 7/2003 | Barnett et al. | 711/103 |
| 2003/0198087 A1 | 10/2003 | Kinsey et al. | |
| 2004/0197993 A1 | 10/2004 | Georgescu | |
| 2005/0023656 A1 | 2/2005 | Leedy | |
| 2005/0056880 A1 | 3/2005 | Kim et al. | |
| 2005/0184332 A1 | 8/2005 | Hirooka et al. | |
| 2006/0057798 A1 | 3/2006 | Komori et al. | |
| 2006/0067124 A1 | 3/2006 | Lee et al. | |
| 2006/0098488 A1 | 5/2006 | Tanaka et al. | |
| 2006/0163636 A1 | 7/2006 | Cheng et al. | |
| 2007/0047302 A1 | 3/2007 | Lee et al. | |
| 2007/0127290 A1 | 6/2007 | Kato | |
| 2007/0159880 A1* | 7/2007 | Eitan | 365/184 |
| 2007/0194371 A1 | 8/2007 | Benjamin | |
| 2007/0247902 A1 | 10/2007 | Chen et al. | |
| 2007/0247917 A1 | 10/2007 | Martinelli et al. | |
| 2007/0255893 A1 | 11/2007 | Takeuchi | |
| 2007/0279985 A1* | 12/2007 | Hemink | 365/185.17 |
| 2008/0035973 A1 | 2/2008 | Lin et al. | |
| 2008/0074180 A1 | 3/2008 | Watanabe et al. | |
| 2008/0186772 A1 | 8/2008 | Horch | |
| 2008/0225593 A1 | 9/2008 | Mitros et al. | |
| 2009/0016118 A1 | 1/2009 | Widjaja et al. | |

OTHER PUBLICATIONS

Clendenin, Mike; "eMemory extends OTP to 0.15.mu.m high voltage process," EE Times Asia, Jul. 26, 2006, 1 page.

Datasheet, "Numonyx Embedded Flash Memory(J3vD)," Dec. 2007, 66 pages.

UMC, "Embedded Memory SoC Process Technology," undated, 8 pages. Jun. 3, 2008.

International Search Report and Written Opinion for PCT/US2008/82294, mailed Dec. 19, 2008, 8 pages.

International Search Report and Written Opinion for PCT/US2008/83697, mailed Jan. 9, 2009, 21 pages.

Non Final Office Action for U.S. Appl. No. 12/271,695, mailed Jun. 11, 2010, 11 pages.

UMC, "Embedded Memory SoC Process Technology," undated, 8 pages.

Non Final Office Action for U.S. Appl. No. 12/264,029 mailed May 27, 2010, 11 pages.

Non Final Office Action for U.S. Appl. No. 12/264,060 mailed May 28, 2010, 12 pages.

Non Final Office Action for U.S. Appl. No. 12/264,076 mailed Jun. 1, 2010, 10 pages.

Non Final Office Action for U.S. Appl. No. 12/271,695 mailed Jun. 11, 2010, 11 pages.

* cited by examiner

Floating Gate

Nwell/BuriedN Diffusion

TWO TERMINAL PROGRAMMABLE HOT CHANNEL ELECTRON NON-VOLATILE MEMORY

RELATED APPLICATION DATA

The present application claims priority to and is a continuation of Ser. No. 12/869,469 now U.S. Pat. No. 7,920,426, which '469 application claims priority to and is a continuation of Ser. No. 12/264,060 now U.S. Pat. No. 7,787,304, all of which are hereby incorporated by reference herein. The '060 application in turn claims the benefit under 35 U.S.C. 119(e) of the priority date of Provisional Application Ser. No. 60/984,615 filed Nov. 1, 2007 which is hereby incorporated by reference. The '060 application is also related to the following applications, all of which are also hereby incorporated by reference herein:

INTEGRATED CIRCUIT EMBEDDED WITH NON-VOLATILE ONE-TIME-PROGRAMMABLE AND MULTIPLE-TIME PROGRAMMABLE MEMORY Ser. No. 12/264,029 now U.S. Pat. No. 7,782,668; and METHOD OF OPERATING INTEGRATED CIRCUIT EMBEDDED WITH NON-VOLATILE ONE-TIME-PROGRAMMABLE AND MULTIPLE-TIME PROGRAMMABLE MEMORY Ser. No. 12/264,076 now U.S. Pat. No. 7,787,309.

FIELD OF THE INVENTION

The present invention relates to making non-volatile memories which can be programmed one time, or multiple times in some instances. The invention has particular applicability to applications where is it desirable to customize electronic circuits.

BACKGROUND

One time programmable (OTP) and multi-time programmable (MTP) memories have been recently introduced for beneficial use in a number of applications where customization is required for both digital and analog designs. These applications include data encryption, reference trimming, manufacturing ID, security ID, and many other applications. Incorporating OTP and MTP memories nonetheless typically comes at the expense of some additional processing steps.

An NMOS OTP implementation is disclosed by U.S. Pat. No. 6,920,067, incorporated by reference herein. The device in this reference is programmed with channel hot-hole-injection. The disclosure teaches that the device is programmed into conducting state, after the channel hot hole injection. However, it is unclear whether the device actually works in the way the inventors claim. That is, it is not apparent that the channel current will be initiated to induce hot-hole-injection since the state of the floating gate is unknown and there is no available means to couple a voltage unto the floating gate. An NMOS device will conduct a channel current to initiate the hot hole injection only when the floating gate potential is sufficient to turn on the device, or when the threshold voltage is always low initially to allow channel current conduction. The only way to ensure either scenario is to introduce an additional process step to modify the turn on characteristics of the NMOS. Now assuming the channel is conducting initially and hot holes are injected, the holes injected on the floating gate will make the device more conductive. So the device basically goes from a conductive state (in order to initiate channel current for hot hole injection) to a highly conductive state. This is not a very optimal behavior for a memory device.

Another prior art device described in U.S. Pat. No. 7,939,861 (incorporated by reference herein) shows a slightly different approach to the problem of providing a programming voltage to a floating gate embodiment of an OTP device. In this design, shown in FIG. 4, the drain border length L1 is increased relative to the source side length L1 to increase a coupling ratio to the eraseable floating gate 416. By increasing the coupling ratio, the amount of channel current is increased; therefore the charge injection into the floating gate will also increase. The drawbacks of this cell, however, include the fact that the cell and channel 412 must be asymmetric, and the coupling is only controlled using the length dimension of the active regions. Because of these limitations, it also does not appear to be extendable to a multi-level architecture. Moreover, it apparently is only implemented as a p-channel device.

Accordingly there is clearly a long-felt need for a floating gate type programmable memory which is capable of addressing these deficiencies in the prior art.

SUMMARY OF THE INVENTION

An object of the present invention, therefore, is to overcome the aforementioned limitations of the prior art.

A first aspect of the invention concerns a programmable non-volatile device situated on a substrate comprising: a floating gate; wherein the floating gate is comprised of a material that is also used as a gate for a transistor device also situated on the substrate and associated with a logic gate and/or a volatile memory; a source region; and a drain region; and an n-type channel coupling the source region and drain region; wherein the drain region overlaps a sufficient portion of the gate such that a programming voltage for the device applied to the drain can be imparted to the floating gate through capacitive coupling.

Preferably the programming voltage is greater than 5 volts. In some instances the floating gate can be erased to allow for reprogramming. The floating gate is eraseable by an erase voltage applied to the source region.

The state of the floating gate can be determined by a read signal applied to the drain which is preferably less than about 1 volt.

The inventive device can be part of a programmable array embedded with separate logic circuits and/or memory circuits in an integrated circuit. The data stored in the memory can be used as a part of (or by) a data encryption circuit; a reference trimming circuit; a manufacturing ID; a security ID or other similar applications.

In some embodiments the capacitive coupling can be configured to place in a first trench situated in the substrate. A separate set of second trenches in the substrate can be used as embedded DRAM.

The programmable device can be coupled to a second programmable device in a paired latch arrangement such a datum and its compliment are stored in the paired latch.

In some embodiments the floating gate is being comprised of a material that includes impurities acting as charge storage sites and is also used as an insulating layer for other non-programmable devices situated on the substrate, such as an oxide. In other applications the floating gate is comprised of a material that is also shared by an interconnect and/or another gate for a transistor device also situated on the substrate and associated with a logic gate and/or a volatile memory.

Another aspect of the invention concerns a one-time (OTP) or multi-time (MTP) programmable memory device incorporated on a silicon substrate with one or more other additional logic and/or non-OTP memory devices, characterized in that the OTP memory device has an n-type channel; any and all regions and structures of the OTP memory device are derived solely from corresponding regions and structures used as components of the additional logic and/or non-MTP/OTP memory devices.

Another aspect of the invention concerns a method of forming the above NV OTP/MPT device situated on a substrate comprising the following steps: forming a gate for non-volatile programmable memory device from a first layer; the first layer being shared by the non-volatile programmable memory device and at least one other device also situated on the substrate and associated with a logic gate and/or a volatile memory; forming a drain region; and capacitively coupling the gate with the drain region by overlapping a portion of the gate with the drain region.

As noted above, the first layer is preferably polysilicon, or an insulating layer which has impurities introduced during a source or drain implant step. The device is formed with n-type channel.

Preferably the non-volatile programmable memory device is embedded in a computing circuit and formed entirely by CMOS processing and masks used to form other logic and/or memory n-channel devices in the processing circuit.

The non-volatile memory can be programmed during manufacture if desired to store one or more identification codes for a wafer, and/or can be associated with one of the following: a data encryption circuit; a reference trimming circuit; a manufacturing ID; and/or a security ID.

In other embodiments all regions and structures of the OTP memory device are formed in common with corresponding regions and structures used as components of the additional logic and/or non-OTP memory devices.

A further aspect concerns a method of operating a non-volatile programmable (NVP) device situated on a substrate comprising: providing a floating gate, which floating gate is comprised of a layer and material that is shared by gates of at least some other non-NVP devices on the substrate; programming the NVP device to a first state with channel hot electrons that alter a voltage threshold of a floating gate; reading the first state in the OTP device using a bias current to detect the voltage threshold; and erasing the NVP device with band-band tunneling hot hole injection.

In preferred embodiments the floating gate is comprised of a material that is also used as a gate for a transistor device also situated on the substrate and associated with a logic gate and/or a volatile memory. A substantial portion of the programming voltage applied to the drain is also imparted to the floating gate through the capacitive coupling. In preferred embodiments the threshold of the floating gate is set by a current of channel hot electrons to store data in the OTP device.

It will be understood from the Detailed Description that the inventions can be implemented in a multitude of different embodiments. Furthermore, it will be readily appreciated by skilled artisans that such different embodiments will likely include only one or more of the aforementioned objects of the present inventions. Thus, the absence of one or more of such characteristics in any particular embodiment should not be construed as limiting the scope of the present inventions. While described in the context of a non-volatile memory array, it will be apparent to those skilled in the art that the present teachings could be used in any number of applications.

DETAILED DESCRIPTION

The present disclosure concerns a new type of non-volatile memory device structure (preferably single poly) that can be operated either as an OTP (one time programmable) or as an MTP (multiple time programmable) memory cell. The preferred device structure is fully compatible with advanced CMOS logic process, and would require, at the worst case, very minimal additional steps to implement.

A unique aspect of the present device is that the floating gate of the memory cell structure is electrically coupled strongly through one of the S/D junctions of the transistor, whereas traditional single poly nonvolatile memory cells require either an additional interconnect layer to couple to the floating gate, or the floating gate has virtually none or minimal electrical coupling to any of the existing electrical signals. Moreover, unlike in U.S. Pat. No. 7,939,861, the coupling ratio can be more specific and precise. That is, by exactly controlling the coupling ratio (through areal means) the amount of charge, and thus the final programmed Vt, are directly proportional to the product of the coupling ratio and the drain voltage. It can be more precisely controlled such that the coupling ratio is dictated or designed by the desired programming threshold level ($V_t$) of the memory cell. This allows for a design that evolves easily into a multi-level version of an OTP since different coupling ratios yield different programmed $V_t$.

Figure 1:
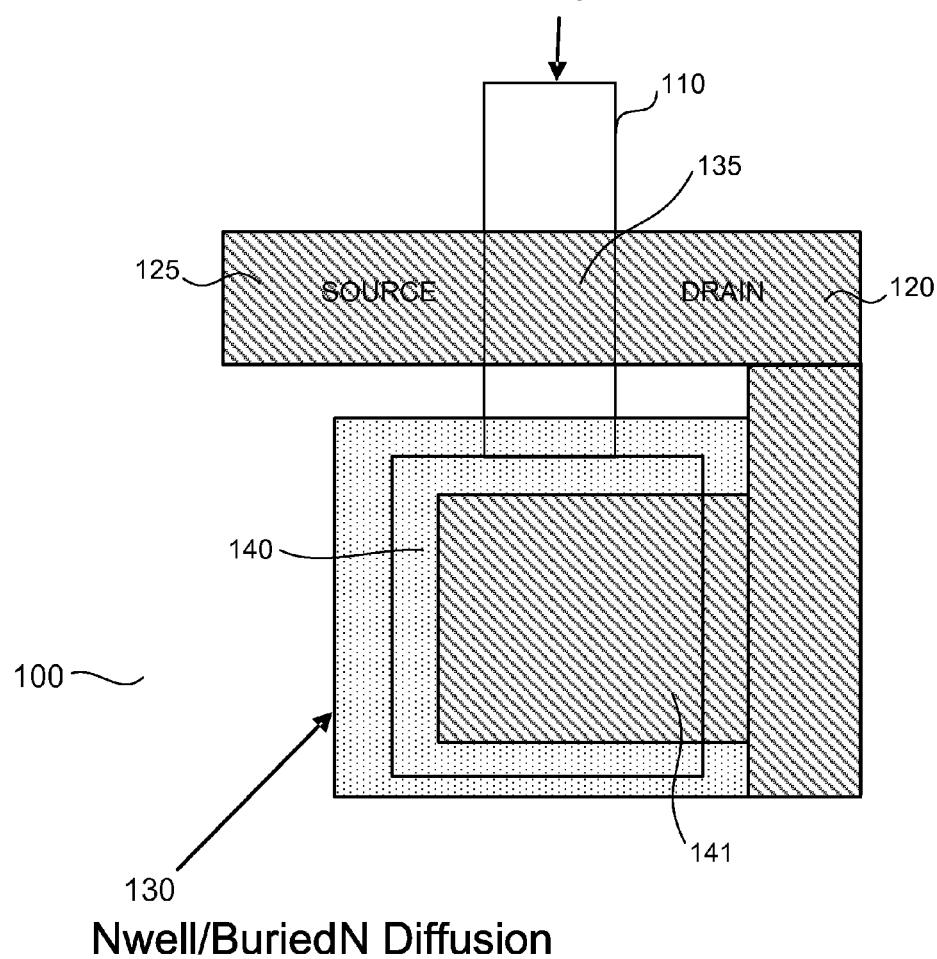
FIG. 1 is a top down view of a preferred embodiment of a non-volatile memory cell of the present invention.
Figure 2:
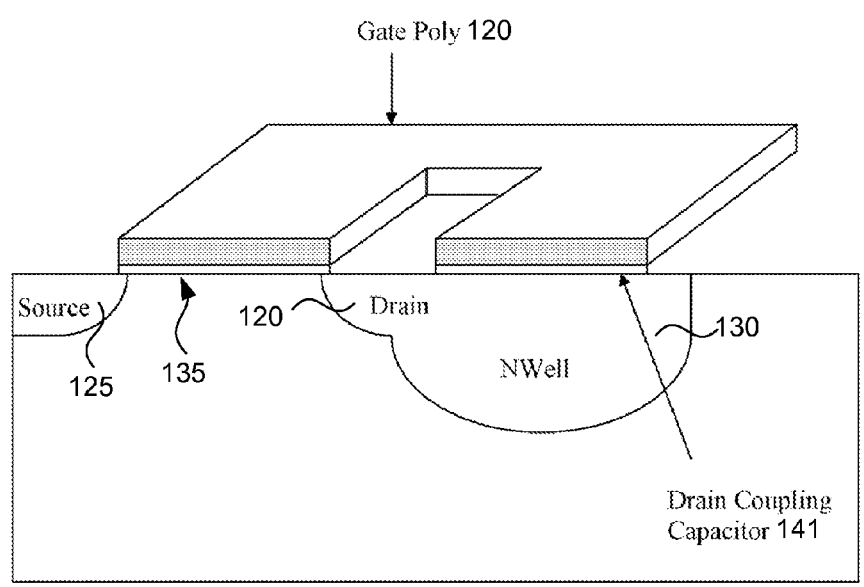
FIG. 2 is a side cross section view of the preferred non-volatile memory cell.

FIG. 1 illustrates the top view of the layout of a preferred structure used in the present invention. FIG. 2 illustrates a representative cross-sectional view of the device structure. It will be understood that these drawings are not intended to be set out to scale, and some aspects of the device have been omitted for clarity.

The device includes a typical NMOS transistor 100 which is modified so that the gate (poly in a preferred embodiment) 110 of the device is not electrically connected to a voltage source. A drain 120 of the device is bent around and is preferably joined by an N-type well 130 that typically already exists in a conventional advanced CMOS process. As an alternative, the N-Well 130 can be replaced with an n-type diffusion layer introduced so as to be beneath the poly floating gate. A conventional source region 125 is also utilized.

The floating gate poly 110 is extended beyond a typical transistor channel region 135 and includes an overlap region 140 which overlaps an active region extending from the drain junction. The active region portion 141 that is surrounded by the N-Well region serves as an effective capacitive coupling to the floating gate. Thus any voltage applied to the drain junction will be effectively coupled onto the floating gate.

Figure 3:
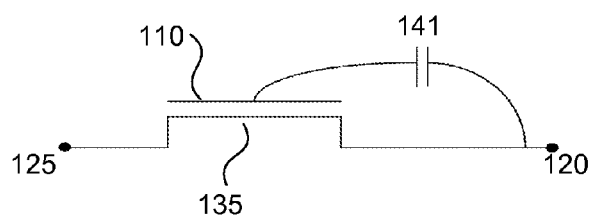
FIG. 3 is an electrical diagram illustrating the electrical relationship of the structures of the preferred non-volatile memory cell.
Figure 4:
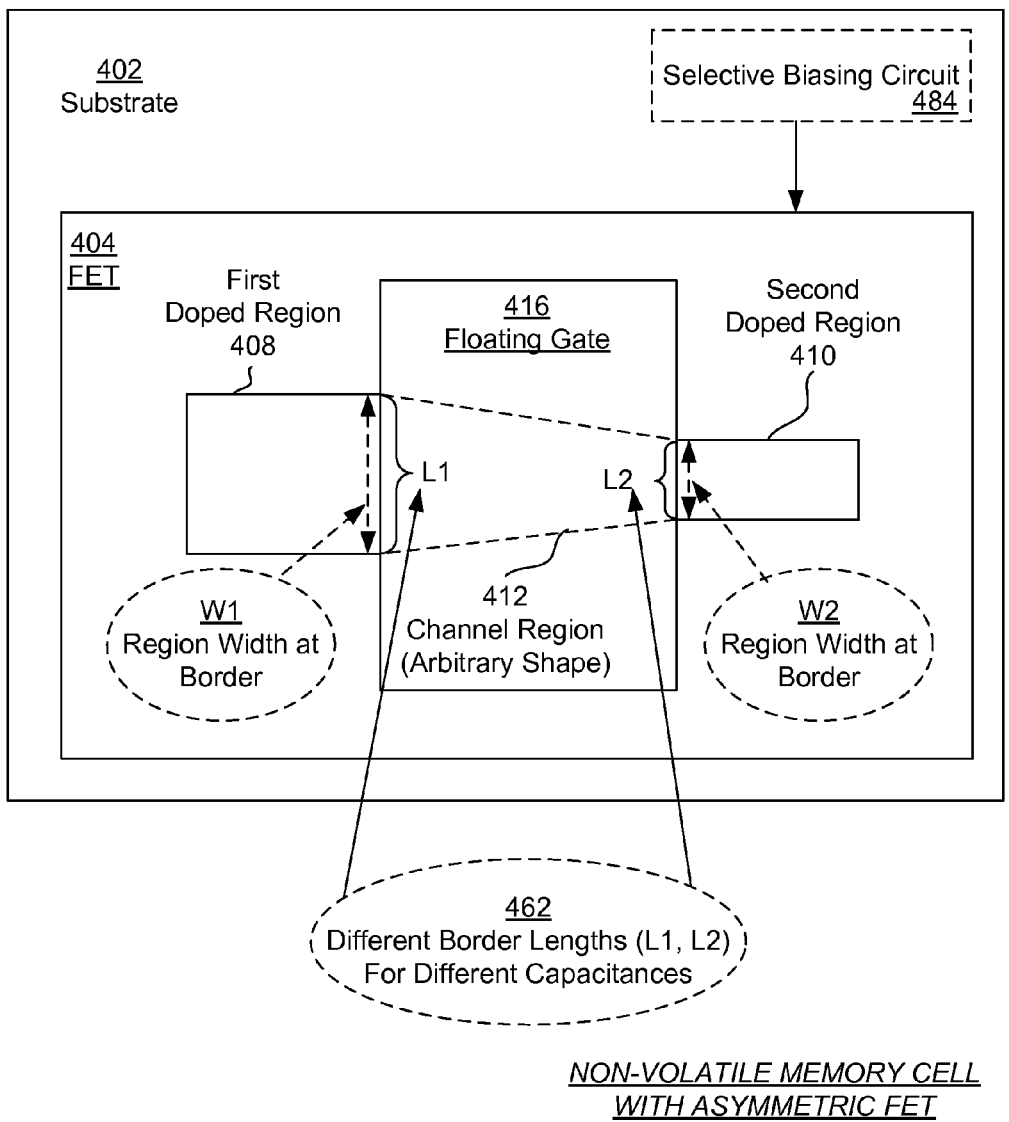
FIG. 4 depicts a prior art non-volatile memory cell which uses a floating gate for an OTP application.

As seen in the electrical diagram of FIG. 3, if the coupling ratio of the drain to the floating gate is sufficiently high—which is determined by the ratio of the area of the gate channel region and the area of the Poly extension overlapping the drain extension region—the floating gate can effectively acquire and have a high percentage of the value of the drain voltage.

A key advantage of the preferred embodiment, as seen in FIGS. 1 and 2, is that it is formed from same layers conventionally used to make active n-channel devices in a CMOS process. The only difference is that the poly (or metal as the case may be) gate layer is not interconnected with such other formed active devices or coupled to a gate signal. The other implants for the source/drain are also part of a CMOS conventional process. Thus, in most applications the invention can be integrated without any additional processing costs, because the only alteration is to an existing mask for each relevant layer of the wafer being processed.

One other optional variation of this device structure is to make the drain-to-gate coupling capacitor area on the sidewall of a trench. This will greatly reduce the area of the drain-to-gate coupling capacitor. This reduction in cell area may come at the expense of significantly increase the manufacturing process complexity. However, again, in applications where the invention is integrated with certain types of DRAM architectures (especially embedded types), it is possible to incorporate the conventional processing steps for such memories to avoid additional processing costs. Other techniques for coupling a voltage to the floating gate and achieving a desired coupling ratio will be apparent to those skilled in the art.

While the floating gate is shown as a single polysilicon layer, it will be appreciated by skilled artisans that other materials could be used as well. In some applications for example it may be possible to exploit the formation of other structures/devices which while part of other main underlying logic/memory structures, can be exploited for purposes of making a floating gate of some kind. In this respect it should be noted that floating gates can typically be formed of a number of different materials, including through techniques in which impurities are implanted/diffused into a dielectric/insulating layer.

Moreover while the preferred embodiment depicts the NVM cell as part of a conventional lateral-planar FET structure on a substrate, it will be apparent to those skilled in the art that other geometries/architectures can be used, including non-planar structures. Thus the invention could be used in SOI substrates, in thin film structures, at other levels of the device than the substrate, in multi-gate (FINFET type) orientations, and in vertical/non-planar configurations. In such latter instances the floating gate would be embedded and oriented vertically with respect to the substrate.

The preferred operation of device 100 will be described. The non-volatile device structure preferably has the physical features of a conventional I/O transistor implemented in an advanced CMOS logic process. At present, such I/O transistor is nominally operated at 3.3V but it will be understood that this value will change with successive generations of manufacturing.

This type of I/O transistor typically has a threshold voltage of 0.5V to 0.7V, with a typical electrical gate oxide thickness of 70 A. With a drain coupling to floating gate ratio of 0.90, and a read drain voltage of 1.0V applied to the device, the floating gate will effectively be coupled with a voltage of about 0.90V. This is sufficient to turn on the un-programmed NMOS device 100, and a channel current can be detected by typical means of sense circuitry to identify the state of the device. It will be understood to those skilled in the art that the particular coupling ratio, read voltage, etc., will vary from application to application and can be configured based on desired device operating characteristics.

The device is originally in a unprogrammed state, which in the preferred embodiment is characterized by a low resistance coupling between the source and drain through channel region 135. This means that the channel region 135 can be substantially uniform and current flow is reliable. While the preferred embodiment is shown in the form of a symmetric cell/channel, it will be understood that the invention could be used in non-symmetric forms such as shown in U.S. Pat. No. 7,939,861.

To program the device into a programmed state, the device must be shut off by reducing carriers in the channel region, and increasing the threshold voltage. To do this a drain voltage of 6.0V can be applied and this will effectively couple a voltage of about 5.4V to the floating gate. This bias condition will placed the device into a channel hot electron injection regime. The electrons injected into the floating gate effectively increase the threshold voltage of the device. When a subsequent read voltage of 1.0V is applied again on the drain, the device does not conduct current due to its high threshold voltage, and this second state of the device is thus determined. As with the read characteristics, it will be understood to those skilled in the art that the particular coupling ratio, program voltage, etc., will vary from application to application and can be configured based on desired device operating characteristics.

The prior art referred to above is primarily a one time programmable device, since there is no disclosed mechanism for removing the charge on the floating gate. In contrast, some embodiments of the present invention can be made to be capable of multiple-time-programming. To do this, an erase operation can be introduced to remove or neutralize the electrons that have been injected into the floating gate. The mechanism for removing or neutralizing electrons is preferably through band-band tunneling hot hole injection from the other non-coupling junction 125 of the device. The preferred bias condition would be as followed: the non-coupling junction (source junction) is biased with 6V to cause the junction to initiate band-band tunneling current. The band-band tunneling current causes hot holes to be injected into the floating gate and neutralize the electrons that are stored on the floating gate. Thus it is (re)programmed from a non-conducting, or even a low conducting state, into a conducting state. The device is then able to conduct channel current when a subsequent read voltage is applied to the coupling junction during the read operation. It will be understood that programming from a low conducting state to a conducting state may have a limited operating sense window.

As an additional optional operation, to facilitate erase operation and enhance band-band tunneling current, the coupling junction can be supplied with a negative voltage so that the floating gate is made more negative to cause higher band-band tunneling current across the source junction.

Thus the operating characteristics are preferably as follows:

| OPERATION | Drain | Source | Substrate |
|---|---|---|---|
| Program | 6.0 V | 0 V | 0 V |
| Read | 1.0 V | 0 V | 0 V |
| Erase | Float or -Vcc | 6.0 V | 0 V |

Figure 5:
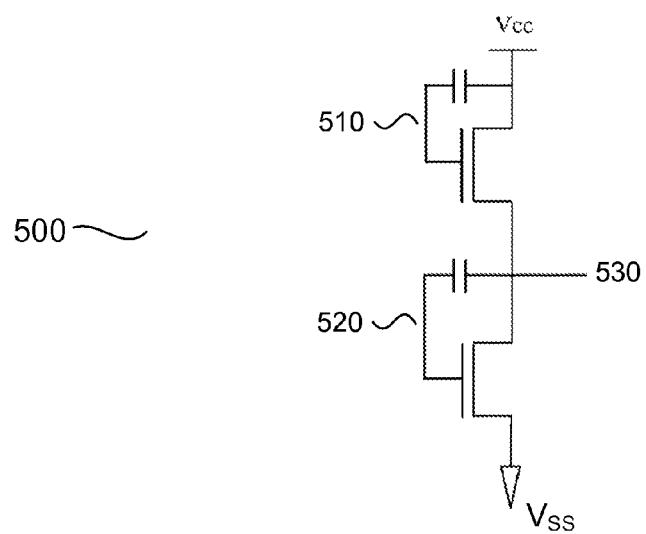
FIG. 5 is an electrical diagram showing a preferred embodiment of a latch circuit constructed with the NV memory cells of the present invention.

In some embodiments, additional protection can be implemented to ensure the OTP and MTP device have sufficient immunity against the loss of charge stored on the floating gate. To do this, the device can be configured into a paired latch 500—as shown in FIG. 5—where the data and its complement are stored into the latch, thus effectively doubling the margin in the stored data. As seen therein, a top device 510 couples a node 530 to a first voltage reference (Vcc) while a second bottom device 520 couples the node to a second voltage reference (Vss). By placing charge on the top device floating gate, the top device 510 is programmed into a non-conductive state, thus ensuring that node 530 is pulled down by bottom device 520 to Vss, representing a first logical data value (0). Similarly, by placing charge on the bottom device floating gate, the bottom device 520 is programmed into a non-conductive state, thus ensuring that node 530 is pulled up by top device 510 to Vcc, representing a second logical data value (1).

Another useful advantage of the present preferred embodiment is that it is implemented with an NMOS device structure, whereas most traditional single-poly OTPs are commonly implemented with a PMOS device structure. This means that the device can be formed at the same time as other n-channel devices on a wafer. Another advantage of an NMOS device structure in this invention is that it behaves similar to an EPROM device, i.e., the device is programmed into a non-conducting state from a conducting state. In contrast, the U.S. Pat. No. 7,939,861 device—and other commonly used PMOS OTP devices—are programmed from a non-conducting state into a conducting state.

This aspect of the invention thus can eliminate the need of an additional masking step that is commonly associated with a PMOS OTP device in order to make sure that PMOS device is in a non-conducting state coming out of the manufacturing fab.

In addition, since an NMOS device's programming mechanism with channel hot electrons injection is self-limiting, unlike that case of a PMOS with channel hot electron programming, the amount of energy consumption during programming is self-limited for this invention.

As seen in the present description therefore, the particular configuration of the floating gate is not critical. All that is required is that it be structurally and electrically configured to control channel conduction and also be capacitively coupled to an electrical source of charge carriers. The particular geometry can be varied in accordance with any desired layout or mask. In some instances it may be desirable to implement the floating gate as a multi-level structure for example. Moreover, since capacitive coupling is a function of the materials used, the invention allows for significant flexibility as the composition of the floating gate can also be varied as desired to accommodate and be integrated into a particular process. An array of cells constructed in accordance with the present teachings could include different shapes and sizes of floating gates so that cells having threshold cells could be created.

The above descriptions are intended as merely illustrative embodiments of the proposed inventions. It is understood that the protection afforded the present invention also comprehends and extends to embodiments different from those above, but which fall within the scope of the present claims.

What is claimed is:

1. A two terminal programmable non-volatile device situated on a substrate, the device comprising:
    a first diffusion region coupled to a first terminal; and
    a second diffusion region coupled to a second terminal; and
    a channel coupling said first diffusion region and second diffusion region;
    a floating gate comprised of polysilicon, which floating gate is situated over at least a portion of said channel;
    wherein the device is adapted such that a channel hot electron current can be induced in said channel by a voltage potential imposed across said first terminal and said second terminal by a single program voltage, and which voltage potential is sufficient to cause injection into said floating gate and program the device,
    wherein the first diffusion region overlaps a sufficient areal portion of said floating gate to permit a threshold voltage of the device to be controlled by a coupling ratio determined by said areal portion and said single program voltage applied to said second diffusion region.

2. The programmable device of claim 1 wherein said single program voltage can be applied across said first terminal and said second terminal.

3. The programmable device of claim 1 wherein a substrate under said channel can be biased to enhance hot electron generation.

4. The programmable device of claim 1 wherein charge can be imparted to said floating gate by the single program voltage through areal capacitive coupling between said floating gate and said first diffusion region.

5. The programmable device of claim 1 wherein said device can be re-programmed.

6. The programmable device of claim 1 wherein a state of said floating gate can be determined by a read signal applied to said second diffusion region.

7. The programmable device of claim 6, wherein said read signal is less than about 1 volt.

8. The programmable device of claim 1 wherein said device is part of a programmable array embedded with at least one of a separate logic circuit and/or a memory circuit in an integrated circuit.

9. The programmable device of claim 1 wherein said device is part of a programmable array embedded with separate analog circuits within an integrated circuit.

10. The programmable device of claim 1 wherein said floating gate is comprised of a polysilicon layer used for a logic gate within the same integrated circuit.

11. The programmable device of claim 1 wherein said device is associated with at least one of a data encryption circuit; a reference trimming circuit; a manufacturing ID; or a security ID.

12. The programmable device of claim 1, wherein a threshold voltage of said device can be set to multiple discrete levels.

13. The programmable device of claim 1, wherein the device is part of a programmable memory array.

14. A two terminal programmable non-volatile device situated on a substrate, the device comprising:
    a first n-type diffusion region coupled to a first terminal; and
    a second n-type diffusion region coupled to a second terminal; and
    an n-type channel coupling said first diffusion region and second diffusion region;
    a floating gate comprised of polysilicon, which floating gate is situated over at least a portion of said channel and is adapted to store electrical charge corresponding to a logic state of the device;
    further wherein the device is adapted such that a channel hot electron current can be induced in said channel sufficient to cause injection into said floating gate using a single programming voltage applied only to at most one of said first and second terminals,
    wherein the first diffusion region overlaps a sufficient areal portion of said floating gate to permit a threshold voltage of the device to be controlled by a coupling ratio determined by said areal portion and said single programming voltage applied to said second diffusion region.

15. A one-time programmable (OTP) two terminal memory device incorporated on a silicon substrate with at least one other additional logic device or non-OTP memory device, characterized in that:
- a. the OTP memory device has a first diffusion region and a second diffusion region;
- b. the OTP memory device has a floating gate overlying at least in part a channel region extending between said first diffusion region and said second diffusion region; wherein said channel is adapted to have a low resistance when the device is in an unprogrammed state, and a high resistance when the device is in a programmed state; and
- c. any and all regions and structures of said OTP memory device are derived solely from corresponding regions and structures used as components of the at least one device, including said n-type diffusion region which is used by said at least one device;
- d. the OTP memory device can be set to said programmed state by hot channel electron injection induced by a potential between said first diffusion region and said second diffusion region caused by a single programming voltage coupled to the OTP memory device.

16. The OTP memory device of claim 15 wherein said single programming voltage results in a programming voltage being coupled through an areal portion between said first diffusion region and said floating gate.

17. The OTP memory device of claim 15 wherein a coupling ratio in said areal portion is at least 90%.

18. The OTP memory device of claim 15 wherein said floating gate can be erased.

19. The OTP memory device of claim 15 wherein said device can be re-programmed.

20. The OTP memory device of claim 15 wherein said floating gate is eraseable by an erase voltage applied to a source region.

21. The OTP memory device of claim 15 wherein a state of said floating gate can be determined by a read signal applied to said first diffusion region.

22. The OTP memory device of claim 15 wherein said device is associated with at least one of a data encryption circuit; a reference trimming circuit; a manufacturing ID; or a security ID.

23. The OTP memory device of claim 15, wherein a threshold voltage of said OTP memory device can be set to multiple discrete levels.

* * * * *